United States Patent
Chen et al.

(10) Patent No.: US 11,699,654 B2
(45) Date of Patent: Jul. 11, 2023

(54) ELECTRONIC DEVICE PACKAGE AND METHOD OF MANUFACTURING THE SAME

(71) Applicant: Advanced Semiconductor Engineering, Inc., Kaohsiung (TW)

(72) Inventors: Shao-An Chen, Kaohsiung (TW); Chih-Yi Huang, Kaohsiung (TW); Ping Cing Shen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 139 days.

(21) Appl. No.: 17/243,456

(22) Filed: Apr. 28, 2021

(65) Prior Publication Data

US 2022/0352066 A1    Nov. 3, 2022

(51) Int. Cl.
| | | |
|---|---|---|
| *H01L 23/522* | (2006.01) | |
| *H01L 23/31* | (2006.01) | |
| *H01L 23/00* | (2006.01) | |
| *H01L 21/48* | (2006.01) | |
| *H01L 21/66* | (2006.01) | |

(52) U.S. Cl.
CPC ........ *H01L 23/5226* (2013.01); *H01L 21/486* (2013.01); *H01L 22/12* (2013.01); *H01L 23/31* (2013.01); *H01L 24/14* (2013.01); *H01L 2224/023* (2013.01); *H01L 2224/0401* (2013.01)

(58) Field of Classification Search
CPC ... H01L 23/5226; H01L 21/486; H01L 22/12; H01L 23/31; H01L 24/14; H01L 2224/023; H01L 2224/0401
See application file for complete search history.

(56) References Cited

U.S. PATENT DOCUMENTS

| | | | |
|---|---|---|---|
| 2004/0004284 A1* | 1/2004 | Lee | H01L 23/5226 438/618 |
| 2020/0161248 A1* | 5/2020 | Lee | H01L 25/18 |
| 2021/0167016 A1* | 6/2021 | Lu | H01L 23/5389 |

* cited by examiner

*Primary Examiner* — Douglas W Owens
(74) *Attorney, Agent, or Firm* — Foley & Lardner LLPx

(57) ABSTRACT

An electronic device package includes an encapsulated electronic component, a redistribution layer (RDL) and a conductive via. The RDL is disposed above the encapsulated electronic component. The RDL includes a circuit layer comprising a conductive pad including a pad portion having a curved edge and a center of curvature, and an extension portion protruding from the pad portion and having a curved edge and a center of curvature. The circuit layer further includes a dielectric layer above the RDL. The conductive via is disposed in the dielectric layer and connected to the conductive pad of the RDL. A center of the conductive via is closer to the center of curvature of the edge of the extension portion than to the center of curvature of the edge of the pad portion.

20 Claims, 19 Drawing Sheets

ELECTRONIC DEVICE PACKAGE AND METHOD OF MANUFACTURING THE SAME

TECHNICAL FIELD

The present disclosure generally relates to an electronic device package and method of manufacturing the same, and more particularly, to an electronic device package including a plurality of conductive pads each including an extension portion aligned with an overlying respective conductive via, and method of manufacturing the same.

BACKGROUND

In a chip first package, the chip (also referred to a semiconductor die or die) is likely to be pushed by a mold flow in the process of forming an encapsulation layer, and thus the electrical terminals of the chip are shifted from their predetermined region. The die shift makes it difficult to electrically connect the chip to an overlying electronic component which includes electrical terminals at their predetermined regions. Accordingly, the yield of a conventional chip first package is deteriorated.

SUMMARY

In some embodiments, an electronic device package includes an encapsulated electronic component, a redistribution layer (RDL) and a conductive via. The RDL is disposed above the encapsulated electronic component. The RDL includes a circuit layer comprising a conductive pad including a pad portion having a curved edge and a center of curvature, and an extension portion protruding from the pad portion and having a curved edge and a center of curvature. The circuit layer further includes a dielectric layer above the RDL. The conductive via includes a connection region connected to the conductive pad of the RDL. A center of the connection region of the conductive via is closer to the center of curvature of the edge of the extension portion than to the center of curvature of the edge of the pad portion.

In some embodiments, an electronic device package includes an electronic component, and a redistribution layer (RDL). The RDL is disposed above the electronic component and electrically connected to the electronic component. The RDL includes a circuit layer comprising a first conductive pad and a second conductive pad. The first conductive pad includes a first pad portion having a curved edge and a center of curvature, and a first extension portion protruding from the first pad portion and having a curved edge and a center of curvature. The second conductive pad includes a second pad portion having a curved edge and a center of curvature, and a second extension portion protruding from the second pad portion and having a curved edge and a center of curvature. A first imaginary straight line connecting the center of curvature of the first pad portion and the center of curvature of the second pad portion is non-parallel to a second imaginary straight line connecting the center of curvature of the first extension portion and the center of curvature of the second extension portion.

In some embodiments, a method of manufacturing an electronic device package includes providing an encapsulated wafer comprising a die, measuring an actual position of the die, and forming a redistribution layer (RDL) including a conductive pad and an extension portion based on the actual position of the die. The method further includes forming a conductive via at a predetermined region on the extension portion.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

DETAILED DESCRIPTION

Figure 1:
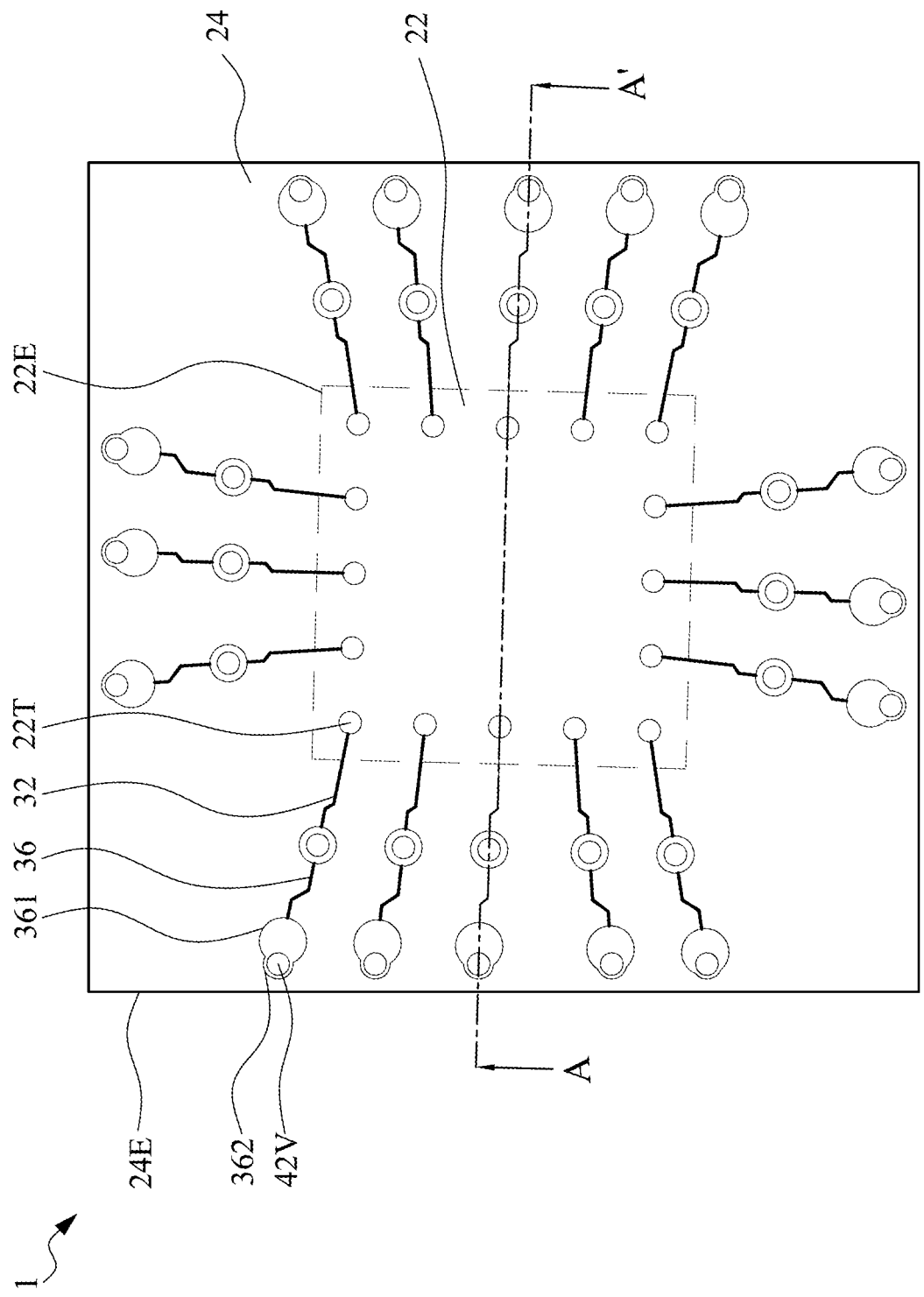
FIG. 1 is a schematic top view of an electronic device package in accordance with some arrangements of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments, or examples, illustrated in the figures are disclosed below using specific language. It will nevertheless be understood that the embodiments and examples are not intended to be limiting. Any alterations and modifications of some of the disclosed embodiments, and any further applications of the principles disclosed in this document, as would normally occur to one of ordinary skill in the pertinent art, fall within the scope of this disclosure.

Further, it is understood that several processing steps (e.g., operations) and/or features of a device may be briefly described. Also, additional processing steps and/or features can be added, and certain of the processing steps and/or features described herein can be removed or changed while implementing the methods described herein or while using the systems and devices described herein. Thus, the following description should be understood to represent examples, and are not intended to suggest that one or more steps or features are required for every implementation. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein the term "active surface" may refer to a surface of a semiconductor die on which electrical terminals such as contact pads, conductive studs or conductive pillars are disposed, and the term "inactive surface" may refer to another surface of the semiconductor die opposite to the active surface on which no contact terminals are disposed.

Figure 1A:
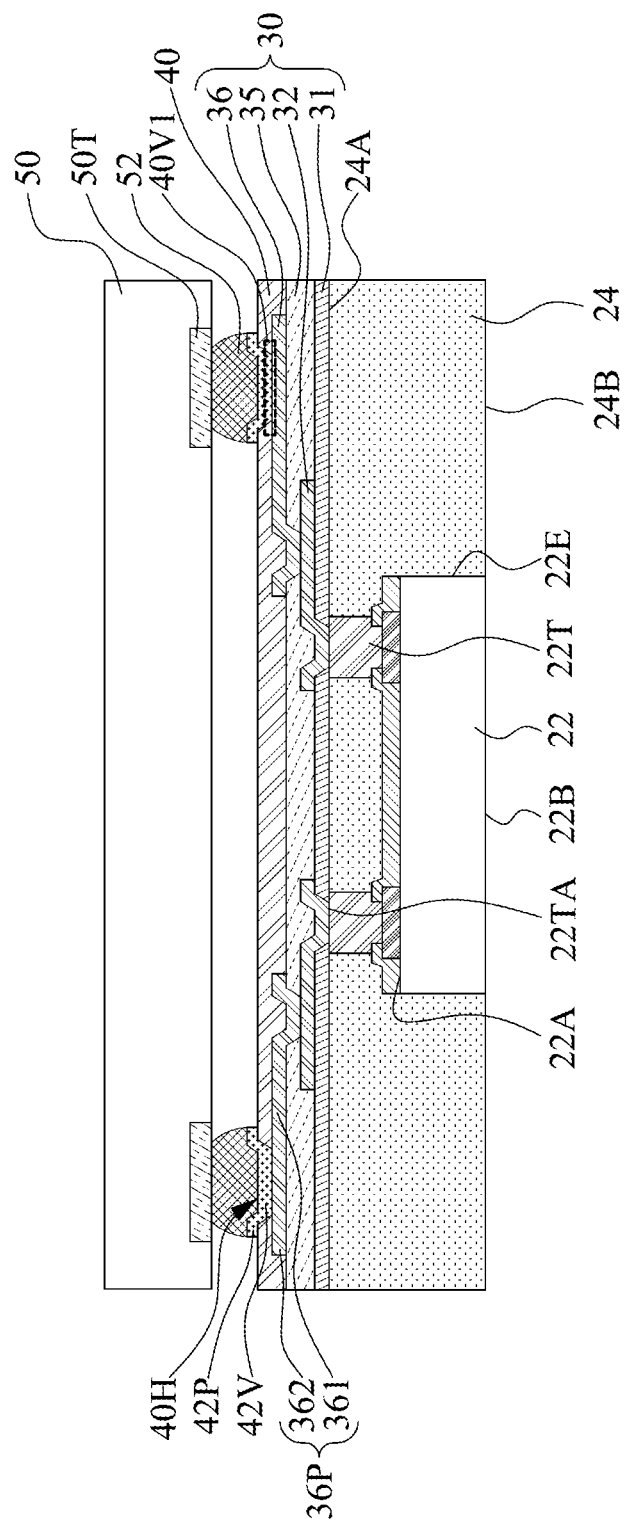
FIG. 1A is a schematic cross-sectional view of the electronic device package of FIG. 1 along a line A-A' in accordance with some arrangements of the present disclosure.
Figure 1B:
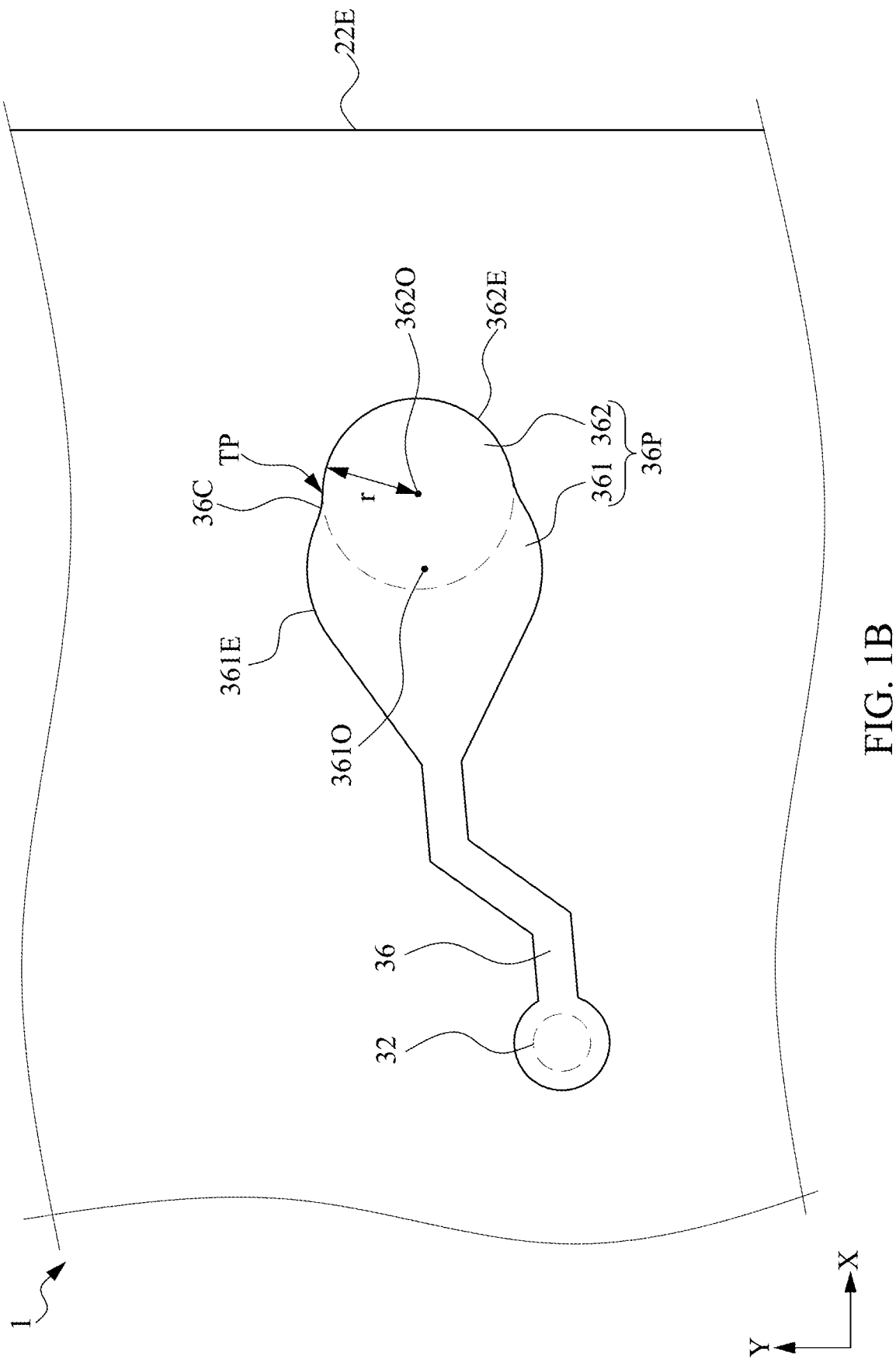
FIG. 1B is an enlarged top view of the electronic device package of FIG. 1 in which some components including a conductive via is omitted in accordance with some arrangements of the present disclosure.
Figure 1C:
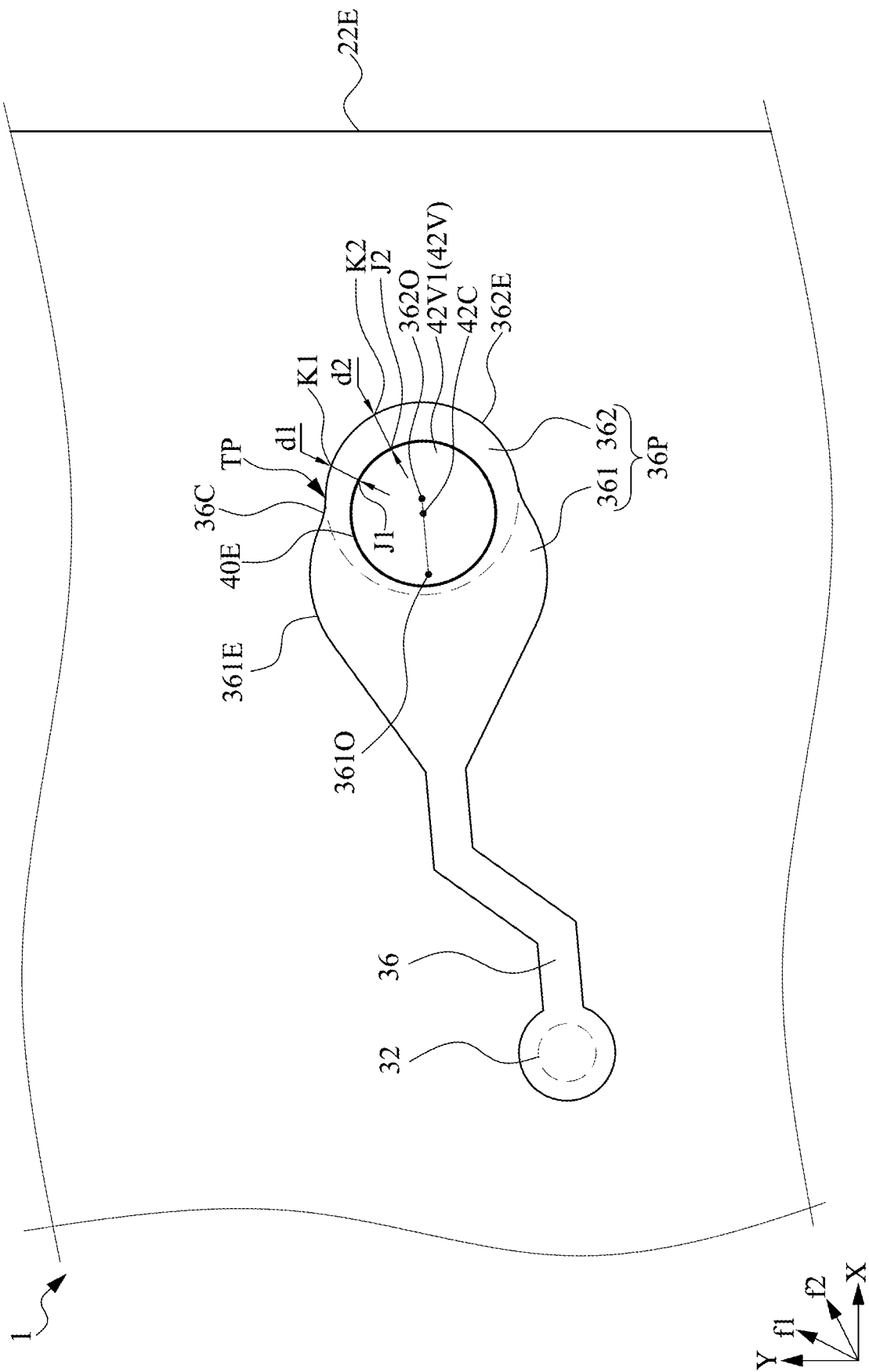
FIG. 1C is an enlarged top view of the electronic device package of FIG. 1 in which a conductive via is drawn in accordance with some arrangements of the present disclosure.

FIG. 1 is a schematic top view of an electronic device package 1 in accordance with some arrangements of the present disclosure, FIG. 1A is a schematic cross-sectional view of the electronic device package 1 of FIG. 1 along a line A-A' in accordance with some arrangements of the present disclosure, FIG. 1B is an enlarged top view of the electronic device package 1 of FIG. 1 in which some components including a conductive via is omitted in accordance with some arrangements of the present disclosure, and FIG. 1C is an enlarged top view of the electronic device package 1 of FIG. 1 in which a conductive via is drawn in accordance with some arrangements of the present disclosure. As shown in FIG. 1, FIG. 1A, FIG. 1B and FIG. 1C, the electronic device package 1 includes at least an electronic component 20, a redistribution layer (RDL) 30, a dielectric layer 40 and a conductive via 42V. In some embodiments, the electronic component 20 is an encapsulated electronic component, which includes at least one semiconductor die 22 and an encapsulation layer 24. The at least one semiconductor die 22 including a plurality of electrical terminals 22T exposed from an active surface 22A of the at least one semiconductor die 22. The electrical terminals 22T may include conductive studs, conductive pillars, contact pads or a combination thereof. In some embodiments, the at least one semiconductor die 22 may include active die such as a logic die or a system on chip (SOC), a passive die such as capacitor, or a combination thereof. The encapsulation layer 24 encapsulates the at least one semiconductor die 22. In some embodiments, the encapsulation layer 24 covers the active surface 22A and edges 22E of the semiconductor die 22. The encapsulation layer 24 may expose an inactive surface 22B of the at least one semiconductor die 22. In some embodiments, the inactive surface 22B of the semiconductor die 22 and a bottom surface 24B of the encapsulation layer 24 may be substantially coplanar. In some embodiments, the inactive surface 22B of the at least one semiconductor die 22 may be inclined with respect to the bottom surface 24B of the encapsulation layer 24. The encapsulation layer 24 may further cover edges of the electrical terminals 22T, and expose top surfaces 22TA of the electrical terminals 22T. The top surfaces 22TA of the electrical terminals 22T and a top surface 24A of the encapsulation layer 24 may be substantially coplanar. The encapsulation layer 24 may include molding compound such as epoxy-based material (e.g. FR4, electronic molding compounds), resin-based material (e.g. Bismaleimide-Triazine (BT)), ABF, Polyimide (PI) or other suitable molding materials. In some embodiments, the encapsulation layer 24 may further include fillers such as silicon oxide fillers dispensed in the molding compound.

The RDL 30 is disposed above the electronic component 20 and electrically connected to the electrical terminals 22T of the at least one semiconductor die 22. In some embodiments, the RDL 30 may be a multi-layered RDL including circuit layers such as copper layers and dielectric layers such as polyimide layers alternately stacked. By way of examples, the RDL 30 may include a plurality of circuit layers 32 and 36. The circuit layer 32 may be disposed above a dielectric layer 31, and referred to as a bottommost circuit layer. The circuit layer 32 may include conductive pads 32P over the dielectric layer 31, and conductive vias 32V through the dielectric layer 31 and electrically connected to the electrical terminals 22T.

The circuit layer 36 is disposed above the circuit layer 32, and another dielectric layer 35 may be disposed between the circuit layer 32 and the circuit layer 36. In some embodiments, the circuit layer 36 may be referred to as a topmost circuit layer. The circuit layer 36 may include a plurality of conductive pads 36P, and conductive vias 36V electrically connected to the conductive pads 32P of the circuit layer 32.

The dielectric layer 40, which may also be referred to as a passivation layer, is disposed above the RDL 30. The dielectric layer 40 includes a via hole 40H configured to receive the conductive via 42V. The material of the dielectric layer 40 may include, but is not limited to, polymeric dielectric material such as polyimide. The conductive via 42V includes a connection region 42V1 connected to the conductive pad 36P of the RDL 30. By way of example, the connection region 42V1 may include a region defined by a profile of a bottom surface of the conductive pad 36P.

The electronic device package 1 may further include a bonding pad 42P disposed on the dielectric layer 40 and connected to the conductive via 42V. The bonding pad 42P may include an under bump metallurgy (UBM), and configured to receive a connector 52 such as a solder ball. The electronic component 20 may be electrically connected to an electrical terminal 50T of an electronic substrate 50 through the connector 52.

As shown in FIG. 1B and FIG. 1C, an edge 22E of the semiconductor die 22 and a respective edge 24E of the encapsulation layer 24 are not parallel. The non-parallel configuration may be caused due to die shift. The die shift may be caused due to alignment variation in disposing the semiconductor die 22 and/or push by mold flow in formation of the encapsulation layer 24. The die shift means the actual positions of the electrical terminals 22T of the semiconductor die 22 are deviated from their predetermined ideal regions with respect to the encapsulation layer 24. Ideally, the RDL 30 is designed to electrically connect the semiconductor die 22 to the bonding pad 42P, which is further connected to another electronic substrate 50. The electronic substrate 50 may include a circuit board such as a printed circuit board (PCB), another encapsulated electronic component such as a package, or other suitable electronic device. The layouts of the circuit layers 32, 36 and the conductive vias 32V and 36V are designed to implement accurate and precise connection between the electronic component 20 underneath the RDL 30 and the bonding pad 42P above the RDL 30. By way of example, the layout of the conductive vias 32V is designed to be aligned with the ideal positions of the electrical terminals 22T, and the layout of the pad portions 361 is designed to be aligned with the positions of the conductive via 42V and the bonding pad 42P. Due to the die shift, the topmost circuit layer 36 cannot be accurately aligned with the conductive vias 42V if the conductive vias 32V of the bottommost circuit layer 32 are relocated to align with the electrical terminals 22T of the shifted semiconductor die 22. Specifically, when the actual positions of the electrical terminals 22T of the semiconductor die 22 are shifted from their predetermined ideal regions, the bottommost circuit layer 32 and the topmost circuit layer 36 of the RDL 30 cannot be aligned with both the actual positions of the electrical terminals 22T of the semiconductor die 22 and the conductive vias 42V at the same time. In some embodiments of the present disclosure, the layout of at least one of the circuit layers 32, 34 or 36 is redesigned such that the RDL 30 can be aligned with both the actual positions of the electrical terminals 22T of the semiconductor die 22 and the positions of the overlying conductive vias 42V.

In some embodiments, at least some of the conductive pads 36P of the circuit layer 36 may include a pad portion 361 and an extension portion 362 protruding from the pad portion 361. In some embodiments, the pad portion 361 has an edge (e.g., a curved edge) 361E, and the extension portion 362 has an edge (e.g., a curved edge) 362E. By way of examples, the pad portion 361 may include a substantially circular shape, and the extension portion 362 may be a circular area defined by using the center of curvature 362O of the extension portion 362 as an origin and a distance r between the center of curvature 362O and curve edge 362E of the extension portion 362 as a radius. A distance of the center of curvature 361O of the edge 361E of the pad portion 361 and the center of curvature 362O of the edge 362E of the extension portion 362 is larger than zero. For example, the center of curvature 361O of the edge 361E of the pad portion 361 and the center of curvature 362O of the edge 362E of the extension portion 362 are eccentric.

The conductive via 42V is in the dielectric layer 40 and the connection region 42V1 of the conductive via 42V is connected to the conductive pad 36P. In some embodiments, the conductive via 42V is through the dielectric layer 40 and the connection region 42V1 is connected to the extension portion 362 of the conductive pad 36P. In some embodiments, the connection region 42V1 of the conductive via 42V is connected to both of a portion of the pad portion 361 and a portion of the extension portion 362 of the conductive pad 36P.

In some embodiments, the conductive via 42V may include a substantially cylinder structure having a center (e.g., a geometric center) 42C. The center 42C of the connection region 42V1 of the conductive via 42V is closer to the center of curvature 362O of the edge 362E of the extension portion 362 than to the center of curvature 361O of the edge 361E of the pad portion 361 as shown in FIG. 1C. In some embodiments, a circular area may be defined by using the center of curvature 362O of the extension portion 362 as an origin and a distance r between the center of curvature 362O and curve edge 362E of the extension portion 362 as a radius, and the connection region 42V1 of the conductive via 42V is located inside the circular area.

In some embodiments, a first distance d1 between a first point J1 of the edge 40E of the connection region 42V1 of the conductive via 42V and a first point K1 of the edge 362E of the extension portion 362 along a first direction f1 perpendicular to the edge 40E of the connection region 42V1 of the conductive via 42V at the first point J1 of the connection region 42V1 of the conductive via 42V is different from a second distance d2 between a second point J2 of the edge 40E of the connection region 42V1 of the conductive via 42V and a second point K2 of the edge 362E of the extension portion 362 along a second direction f2 perpendicular to the edge 40E of the connection region 42V1 of the conductive via 42V at the second point J2 of the conductive via 42. That is, the distance between the center 42C of the connection region 42V1 of the conductive via 42V and the first point K1 is different from the distance between the center 42C of the connection region 42V1 of the conductive via 42V and the second point K2.

In some embodiments, the conductive pad 36 further comprises a connection curved edge 36C connecting the edge 361E of the pad portion 361 and the edge 362E of the extension portion 362. The connection curved edge 36C may include at least one turning point TP between the edge 361E of the pad portion 361 and the edge 362E of the extension portion 362. The curvature of the turning point TP is different from that of the pad portion 361 and that of the extension portion 362.

The extension portion 362 is design to compensate for the shift of the semiconductor die 22. In some embodiments, the shape and/or the area of the extension portion 362 is adjusted based on the degree of shift of the semiconductor die 22 such that the connection region 42V1 of the conductive via 42V can entirely land on the conductive pad 36P such as on the extension portion 362, or on the pad portion 361 and extension portion 362. In some embodiments, the gap between an edge 40E of the via hole 40H and the edge 362E of the extension portion 362 is substantially equal to or larger than the overlay tolerance between the layout of the circuit layer 36 and the layout of the conductive via 42V. The width of the extension portion 362 is a sum of a gap between the edge 40E of the via hole 40H in the layout of the dielectric layer 40 and the conductive pad 36P in the layout of the RDL 30 and the overlay tolerance between the via hole 40H of the dielectric layer 40 and the RDL 30.

Accordingly, electrical connection between the semiconductor die 22 and the electronic substrate 50 can be ensured. More specifically, the shape and/or area of each extension portion 362 can be individually designed based on the degree of shift of the semiconductor die 22 such that each the connection region 42V1 of the conductive via 42V can entirely land on the respective pad portion 361 and extension portion 362. The pattern of the RDL 30 is locally modified to the minimum extent necessary to form the extension portion 362, and thus the design rule and/or spec of the RDL 30 can be satisfied. In addition, the modification of the pattern of the RDL 30 is implemented by a mask-less process, rather than by designing and manufacturing a new photomask. Because the pattern of the RDL 30 is locally modified to the minimum extent necessary, the new layout of the RDL 30 can be rapidly calculated in the mask-less process, and manufacturing throughput can be maintained. Therefore, the manufacturing cost is reduced.

The electronic device package and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 2A:
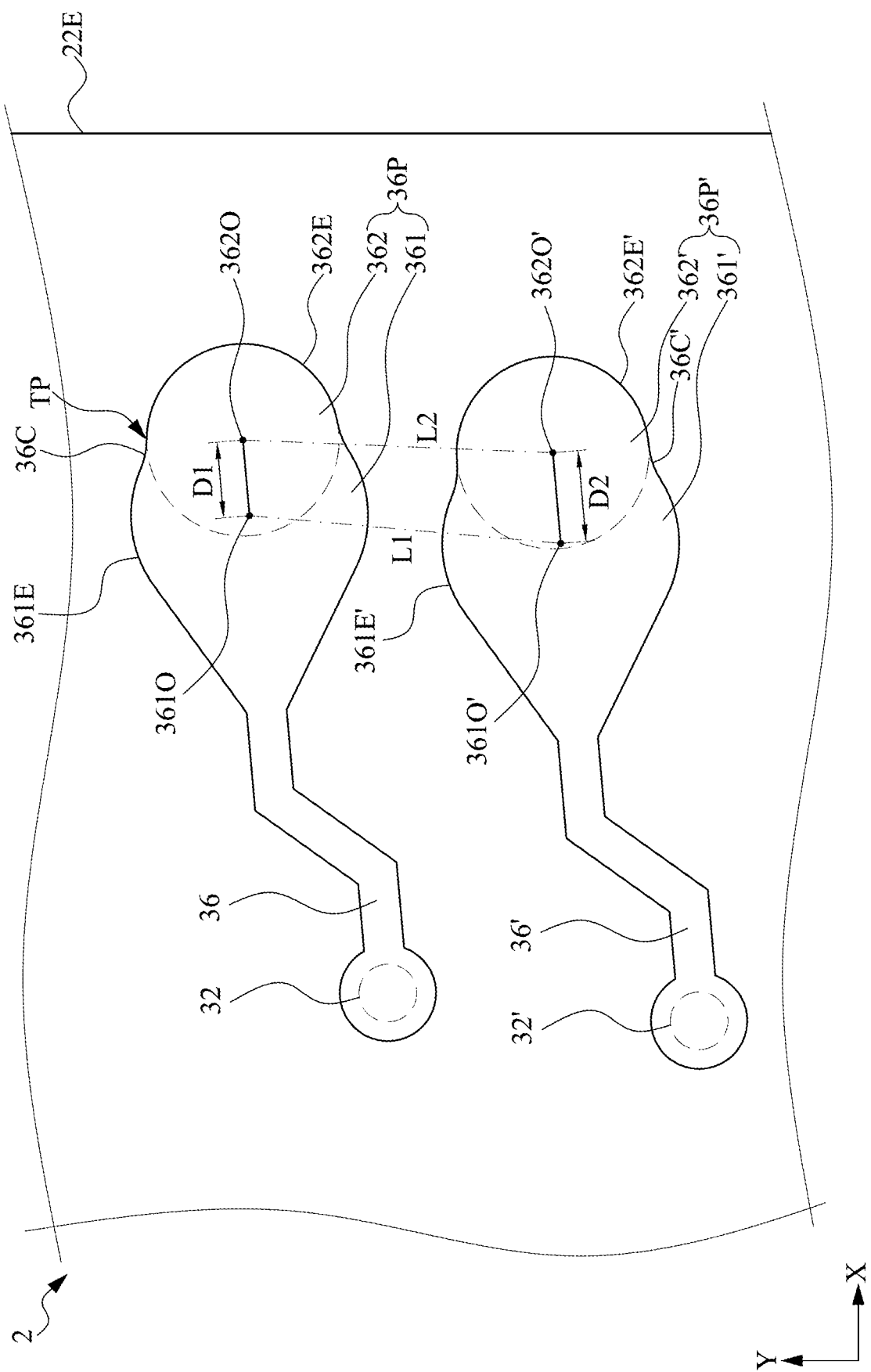
FIG. 2A is a schematic top view of an electronic device package in which some components including conductive vias are omitted in accordance with some arrangements of the present disclosure.
Figure 2B:
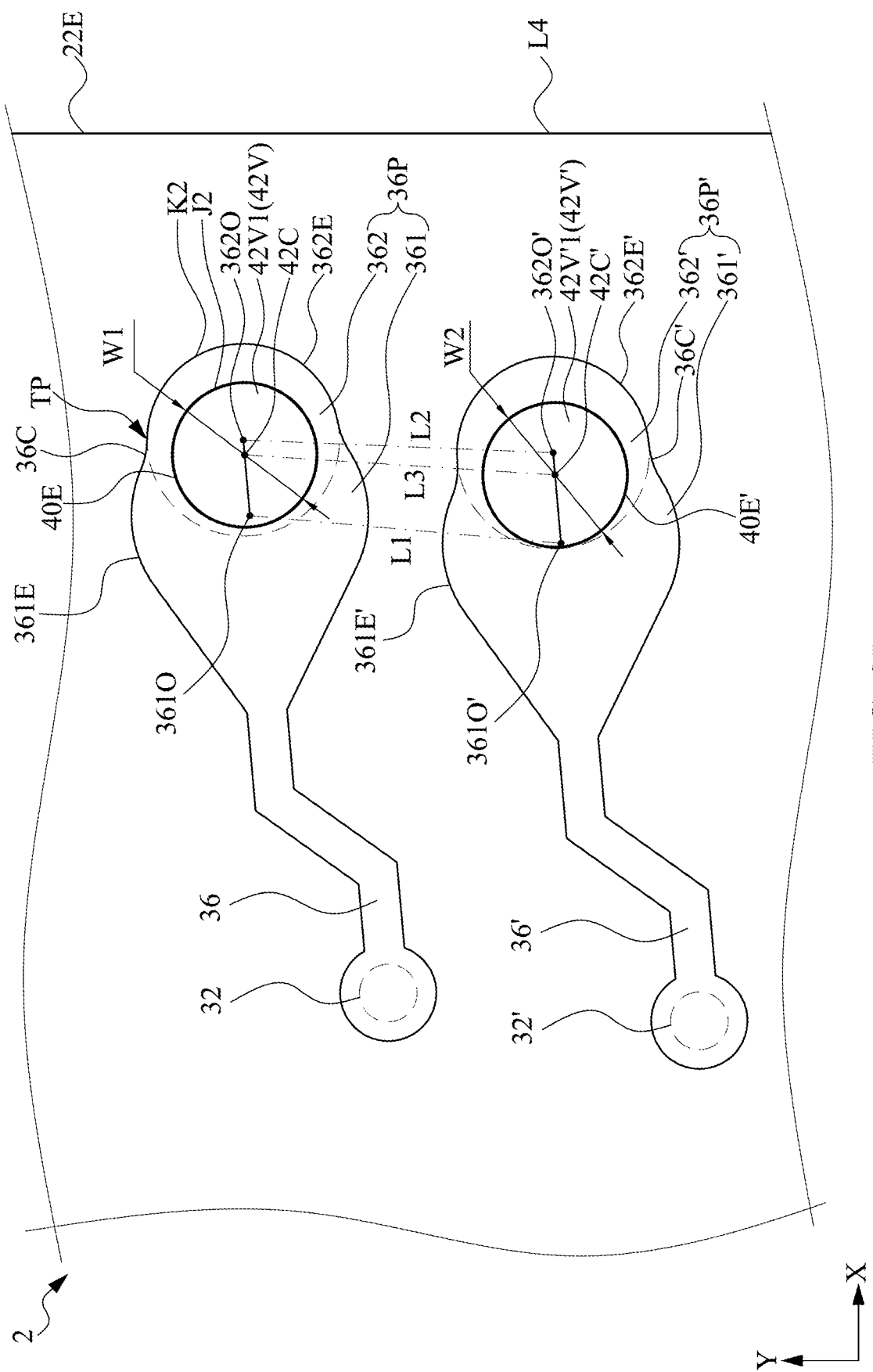
FIG. 2B is a schematic top view of an electronic device package in which conductive vias are drawn in accordance with some arrangements of the present disclosure.
Figure 2C:
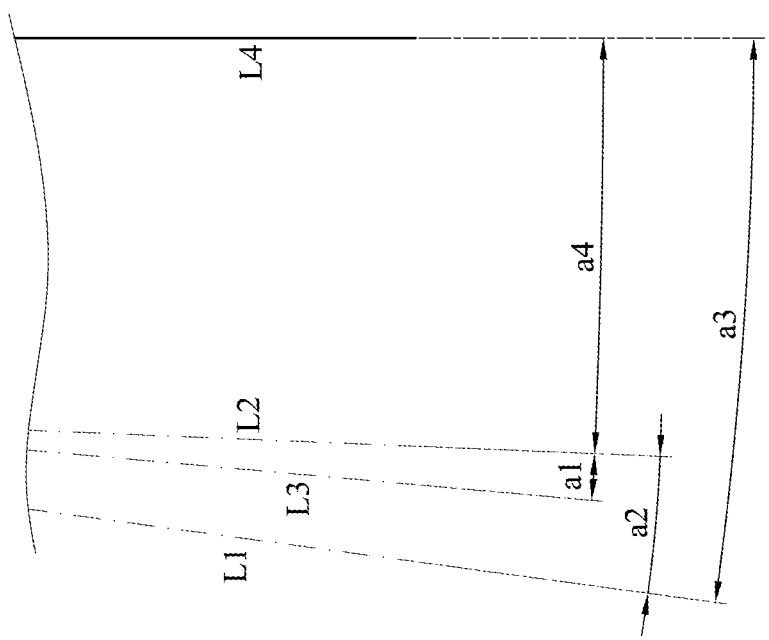
FIG. 2C depicts an orientation relation among the conductive pads, the conductive vias and edge of the electronic device package in accordance with some arrangements of the present disclosure.

FIG. 2A is a schematic top view of an electronic device package 2 in which some components including conductive vias are omitted in accordance with some arrangements of the present disclosure, FIG. 2B is a schematic top view of an electronic device package 2 in which conductive vias are drawn in accordance with some arrangements of the present disclosure, and FIG. 2C depicts an orientation relation among the conductive pads, the conductive vias and edge of the electronic device package 2 in accordance with some arrangements of the present disclosure. As shown in FIG. 2A and FIG. 2B, in contrast to the electronic device package 1, the circuit layer 36 of the electronic device package 2 includes a plurality of conductive pads. By way of example, the circuit layer 36 includes a first conductive pad 36P and a second conductive pad 36P'. The shape and/or area of the first conductive pad 36P is distinct from the shape and/or area of the second conductive pad 36P'.

In some embodiments, the first conductive pad 36P includes a first pad portion 361 and a first extension portion 362 protruding from the first pad portion 362. The second conductive pad 36P' includes a second pad portion 361' and a second extension portion 362' protruding from the second pad portion 361'. In some embodiments, the shape of the first pad portion 361 is the same as the shape of the second pad portion 361', while the shape of the first extension portion 362 is distinct from the shape of the second extension portion 362'. The area of the first pad portion 361 is the same as the area of the second pad portion 361', while the area of the first extension portion 362 is distinct from the area of the second extension portion 362'.

In some embodiments, the first pad portion 361 has an edge (e.g., a curved edge) 361E, and the first extension portion 362 has an edge (e.g., a curved edge) 362E. The second pad portion 361' has an edge (e.g., a curved edge 361E'), and the second extension portion 362' has an edge (e.g., a curved edge) 362E'. A distance of the center of curvature 361O of the edge 361E of the pad portion 361 and the center of curvature 362O of the edge 362E of the extension portion 362 is larger than zero. In some embodiments, a distance D1 between the center of curvature 361O and the center of curvature 362O is different from a distance D2 between the center of curvature 361O' and the center of curvature 362O'. In some embodiments, a first imaginary straight line L1 connecting the center of curvature 361O of the first pad portion 361 and the center of curvature 361O' of the second pad portion 361' is non-parallel to a second imaginary straight line L2 connecting the center of curvature 362O of the first extension portion 362 and the center of curvature 362O' of the second extension portion 362'.

In some embodiments, the curvature of the first extension portion 362 is substantially equal to or larger than the curvature of the first pad portion 361, and the curvature of the second extension portion 362' is substantially equal to or larger than the curvature of the second pad portion 361'. The curvature of the first extension portion 362 may be substantially equal to the curvature of the second extension portion 362'.

In some embodiments, the first conductive pad 36P further includes a first connection curved edge 36C connecting the edge 361E of the first pad portion 361 and the edge 362E of the first extension portion 362, and the second conductive pad 36P' further includes a second connection curved edge 36C' connecting the edge 361E' of the second pad portion 361' and the edge 362E' of the second extension portion 362'. The curvature of the first connection curved edge 36C may be different from the curvature of the second connection curved edge 36C' The curvature of the first connection curved edge 36C may be different from the curvature of the first pad portion 361 and the curvature of the first extension portion 362, and the curvature of the second connection curved edge 36C' may be different from the curvature of the second pad portion 361' and the curvature of the second extension portion 362'.

The electronic device package 2 further includes a plurality of conductive vias. By way of example, a first conductive via 42V and a second conductive via 42V' are disposed in the dielectric layer 40. The first conductive via 42V includes a first connection region 42V1 connected to the first conductive pad 36P, and the second conductive via 42V' includes a second connection region 42V'1 connected to the second conductive pad 36P'. In some embodiments, the first connection region 42V1 of the first conductive via 42V may be disposed on the first extension portion 362, and the second connection region 42V1' of the second conductive via 42V' may be disposed on the second extension portion 362'.

In some embodiments, the first conductive via 42V may include a substantially cylinder structure having a center (e.g., a geometric center) 42C. The center 42C of the first connection region 42V1 of the first conductive via 42V is closer to the center of curvature 362O of the edge 362E of the first extension portion 362 than to the center of curvature 361O of the edge 361E of the first pad portion 361. The second conductive via 42V' may include a substantially cylinder structure having a center (e.g., a geometric center) 42C'. The center 42C' of the second connection region 42V1' of the second conductive via 42V' is closer to the center of curvature 362O' of the edge 362E' of the second extension portion 362' than to the center of curvature 361O' of the edge 361E of the second pad portion 361'. In some embodiments, a curvature of the extension portion 362 is substantially equal to or larger than a curvature of the pad portion 361. In some embodiments, a width W1 of the first connection region 42V1 of the first conductive via 42V may be substantially equal to a width W2 of the second connection region 42V1' of the second conductive via 42V'.

Figure 2D:
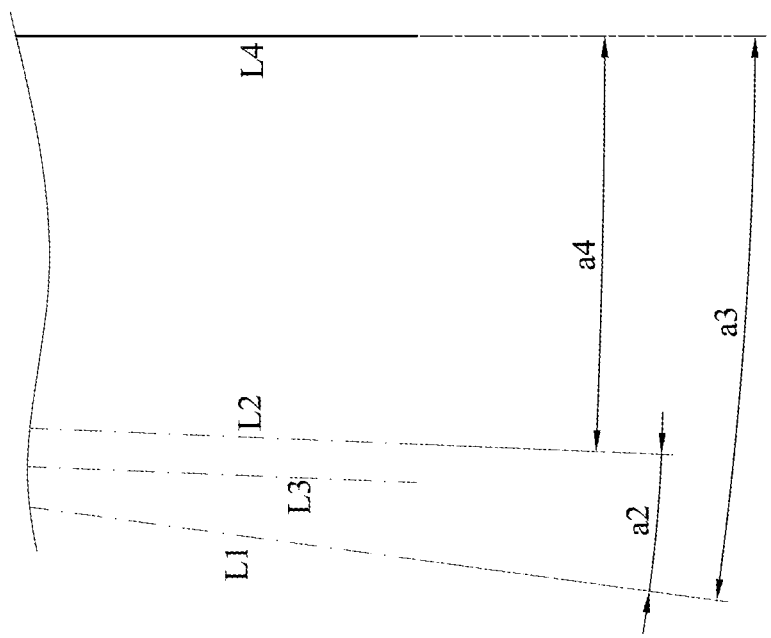
FIG. 2D depicts an orientation relation among the conductive pads, the conductive vias and edge of the electronic device package in accordance with some other arrangements of the present disclosure.

In some embodiments, a third imaginary straight line L3 connects the center 42C of the first connection region 42V1 of the first conductive via 42V and the center 42C' of the second connection region 42V1' of the second conductive via 42V', and an included angle a1 between the third imaginary straight line L3 and the second imaginary straight line L2 is smaller than an included angle a2 between the first imaginary straight line L1 and the second imaginary straight line L2. In some embodiments, an included angle a3 between an edge L4 of the electronic device package 2 and the first imaginary straight line L1 is larger than an included angle a4 between the edge L4 of the electronic device package 2 and the second imaginary straight line L2 as shown in FIG. 2C. FIG. 2D depicts an orientation relation among the conductive pads, the conductive vias and edge of the electronic device package in accordance with some other arrangements of the present disclosure. In some alternative embodiments, the second imaginary straight line L2 and the third imaginary straight line L3 may be substantially parallel as shown in FIG. 2D.

The semiconductor die 22 may be shifted along both direction X and direction Y, the degree of shift of the first conductive pad 36 and the second conductive pad 36' are different. Thus, the shape and/or the area of the first extension portion 362 and the second extension portion 362' are individually adjusted such that the first extension portion 362 and the second extension portion 362' can accurately align with the first conductive via 42V and the second conductive via 42V' respectively.

Figure 3A:
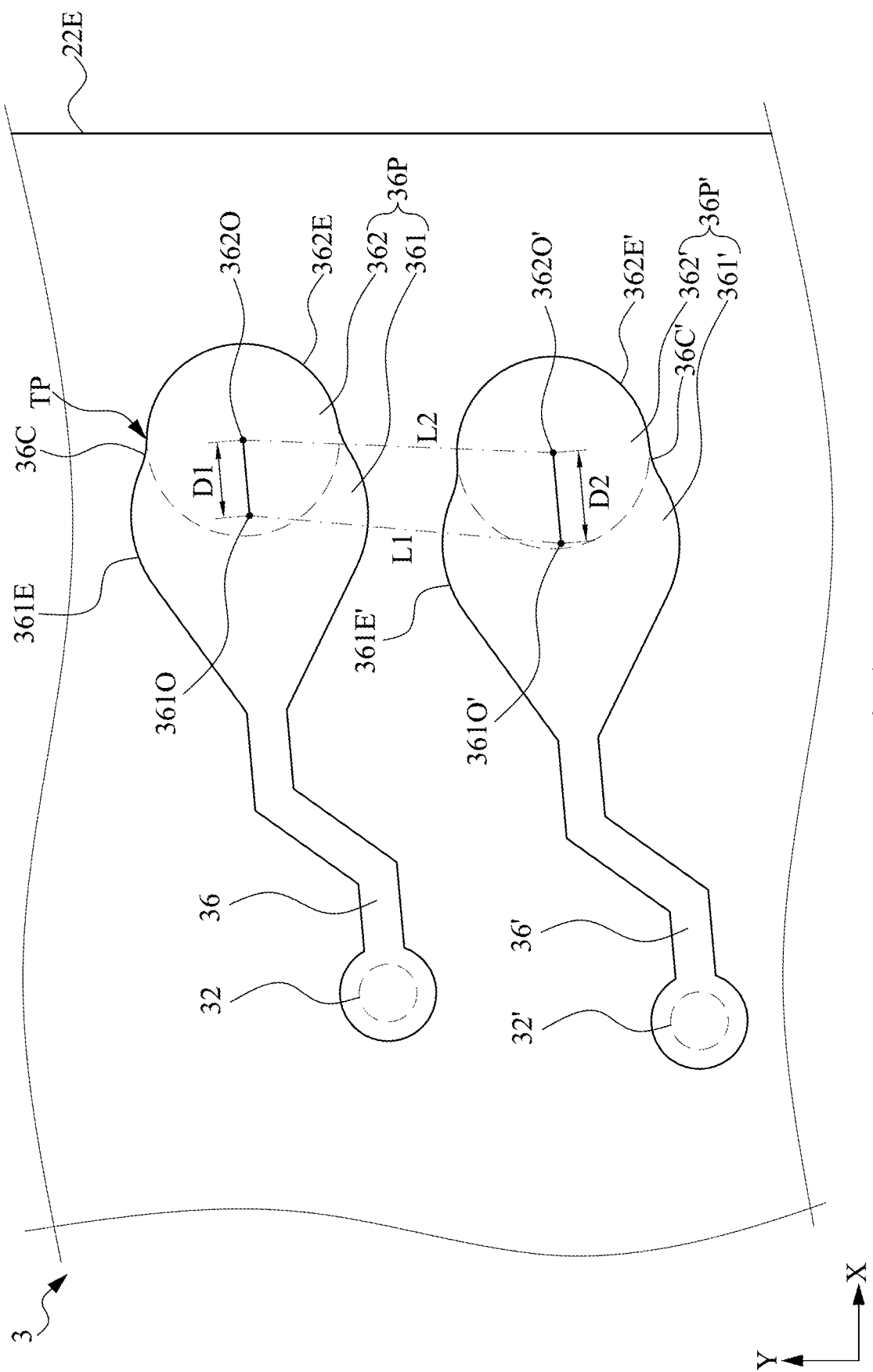
FIG. 3A is a schematic top view of an electronic device package in which some components including conductive vias are omitted in accordance with some arrangements of the present disclosure.
Figure 3B:
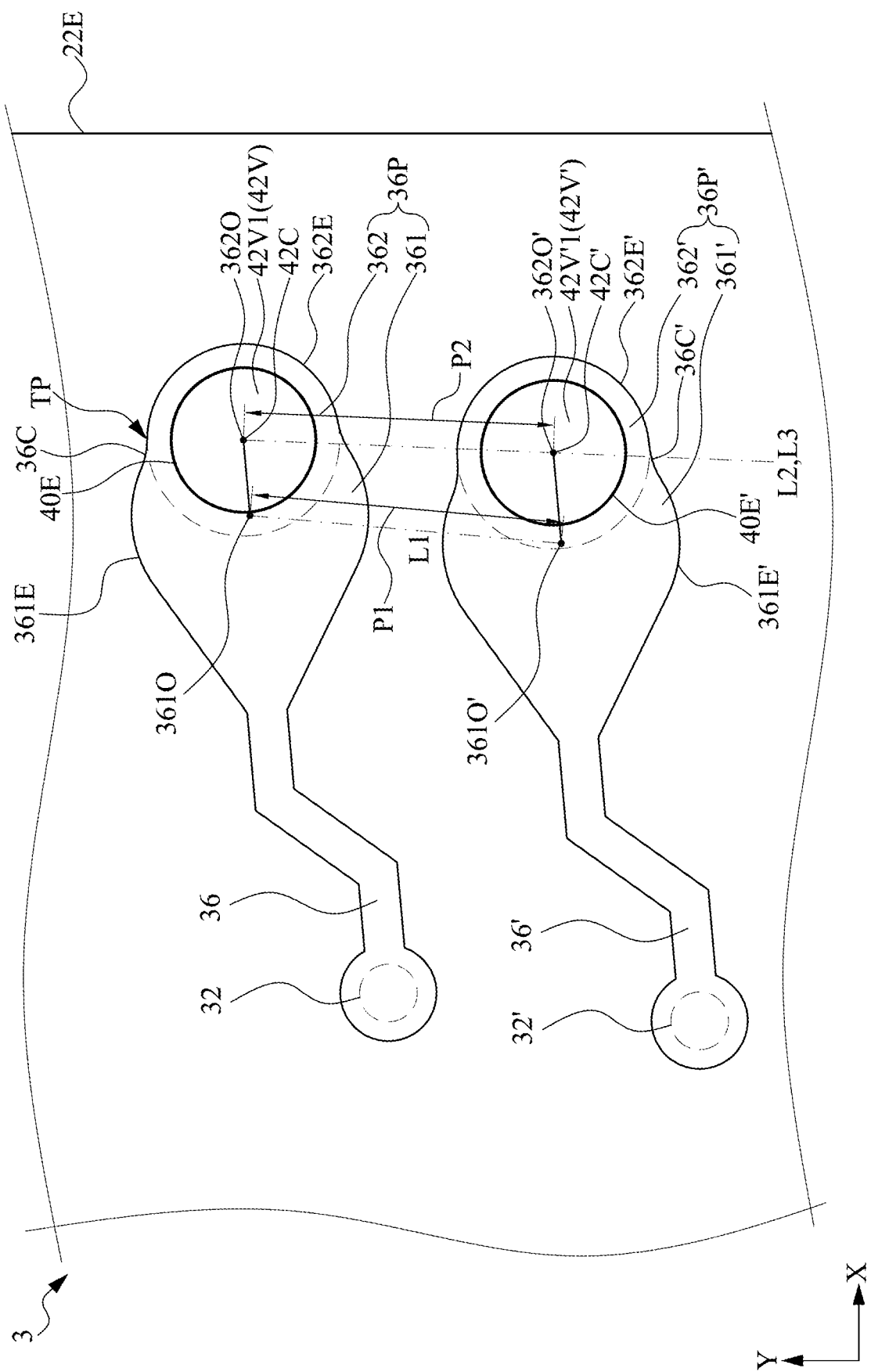
FIG. 3B is a schematic top view of an electronic device package in which conductive vias are drawn in accordance with some arrangements of the present disclosure.

FIG. 3A is a schematic top view of an electronic device package 3 in which some components including conductive vias are omitted in accordance with some arrangements of the present disclosure, and FIG. 3B is a schematic top view of an electronic device package 3 in which conductive vias are drawn in accordance with some arrangements of the present disclosure. As shown in FIG. 3A and FIG. 3B, the configuration of the electronic device package 3 is different from that of the electronic device package 2. The center 42C of the first connection region 42V1 of the first conductive via 42V is located on the center 362O of curvature of the edge 362E of the first extension portion 362. The center 42C' of the second connection region 42V1' of the second conductive via 42V' is located on the center 362O' of curvature of the edge 362E' of the second extension portion 362'. That is, the first conductive via 42V and the first extension portion 362 may be concentric, and the second conductive via 42V' and the second extension portion 362' may be concentric. In some embodiments, a first pitch P1 between the center of curvature 361O of the first pad portion 361 and the center of curvature 361O' of the second pad portion 361' is substantially equal to a second pitch P2 between the center of curvature 362O of the first extension portion 362 and the center of curvature 362O' of the second extension portion 362.

In some embodiments, an imaginary straight line L2 connecting the center 42C of curvature of the first extension portion 362 and the center 42C' of curvature of the second extension portion 362' is substantially parallel to an edge 24E of the encapsulation layer 24. The imaginary straight line L2 is non-parallel to an edge 22E of the semiconductor die 22.

Figure 4:
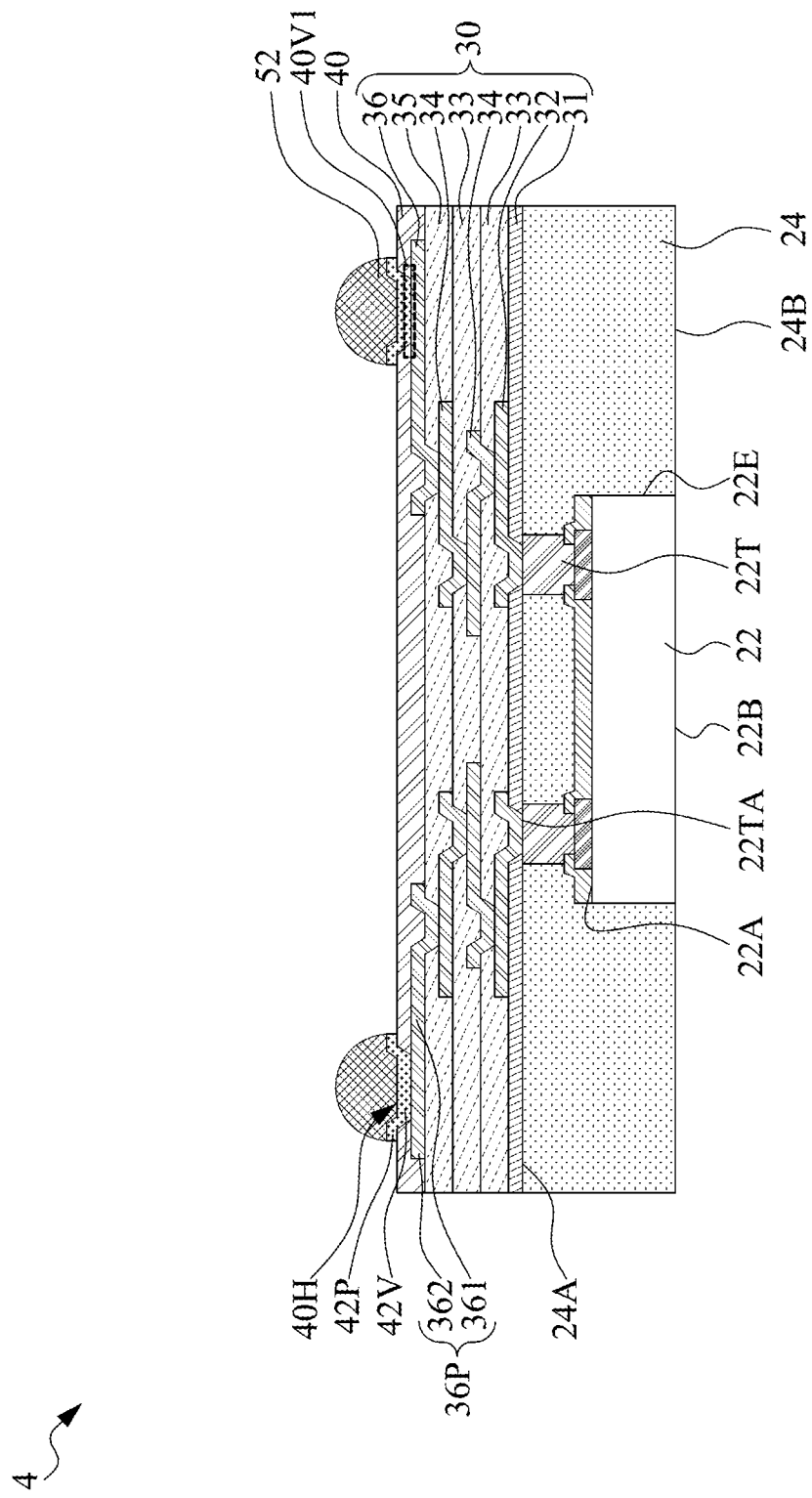
FIG. 4 is a schematic cross-sectional view of an electronic device package in accordance with some arrangements of the present disclosure.

FIG. 4 is a schematic cross-sectional view of an electronic device package 4 in accordance with some arrangements of the present disclosure. As shown in FIG. 4, in contrast to the electronic device package 1, the circuit layer 30 may include more than two circuit layers. By way of example, the circuit layer 30 may be a four-layered circuit including a bottommost circuit layer 32, a topmost circuit layer 36 and two intermediate circuit layers 34 between the bottommost circuit layer 32 and the topmost circuit layer 36. Each intermediate circuit layer 34 is disposed above a respective dielectric layer 33. The conductive pad 36P of the electronic device package 4 may include the additional extension portion 362 similar to that of the electronic device package as disclosed in the aforementioned embodiments, which is not redundantly described.

Figure 5:
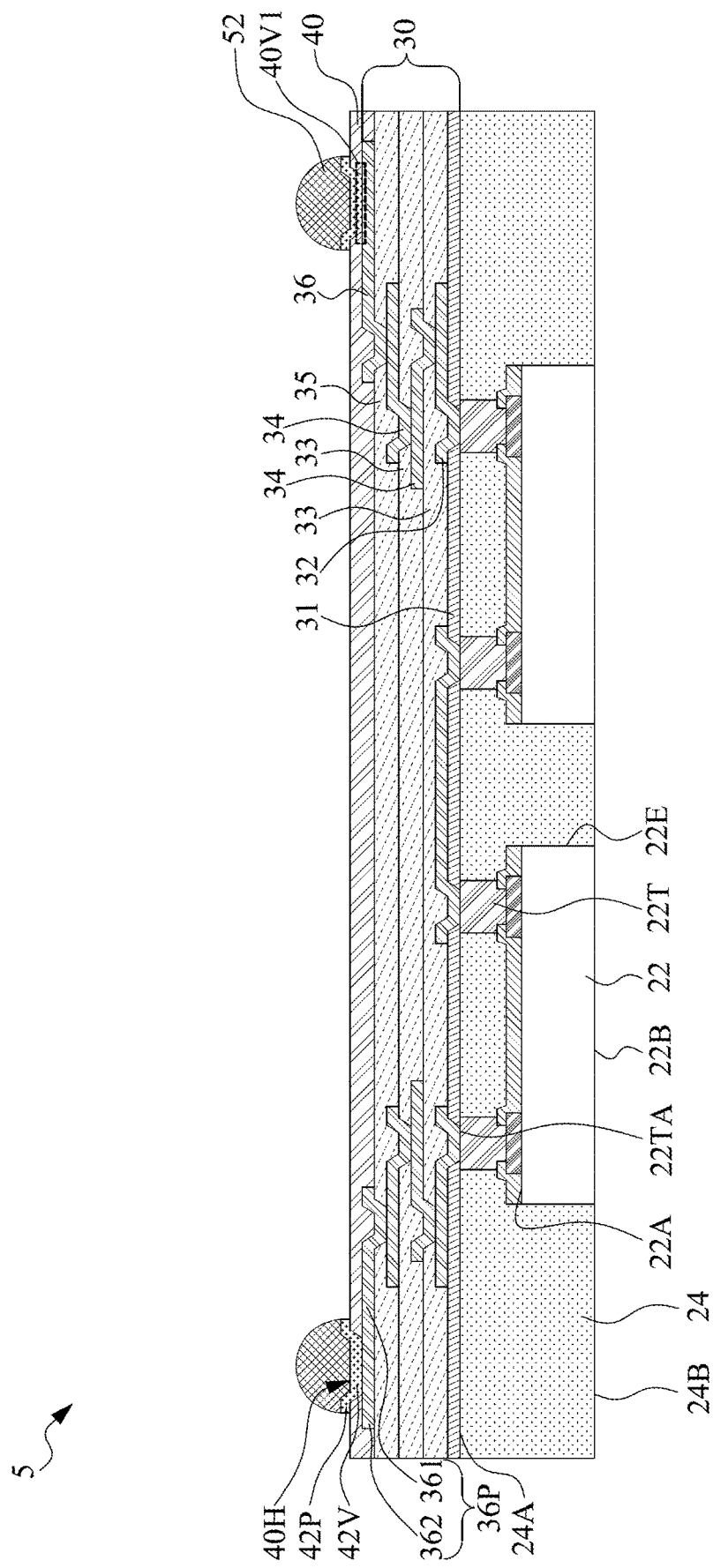
FIG. 5 is a schematic cross-sectional view of an electronic device package in accordance with some arrangements of the present disclosure.

FIG. 5 is a schematic cross-sectional view of an electronic device package 5 in accordance with some arrangements of the present disclosure. As shown in FIG. 5, in contrast to the electronic device package 4, the electronic device package 5 includes a plurality of semiconductor dies 22 encapsulated by the encapsulation layer 24. The semiconductor dies 22 may be electrically interconnected by the circuit layer 30 such as the bottommost circuit layer 32. The conductive pad 36P of the electronic device package 5 may include the additional extension portion 362 similar to that of the electronic device package as disclosed in the aforementioned embodiments, which is not redundantly described.

Figure 6A:
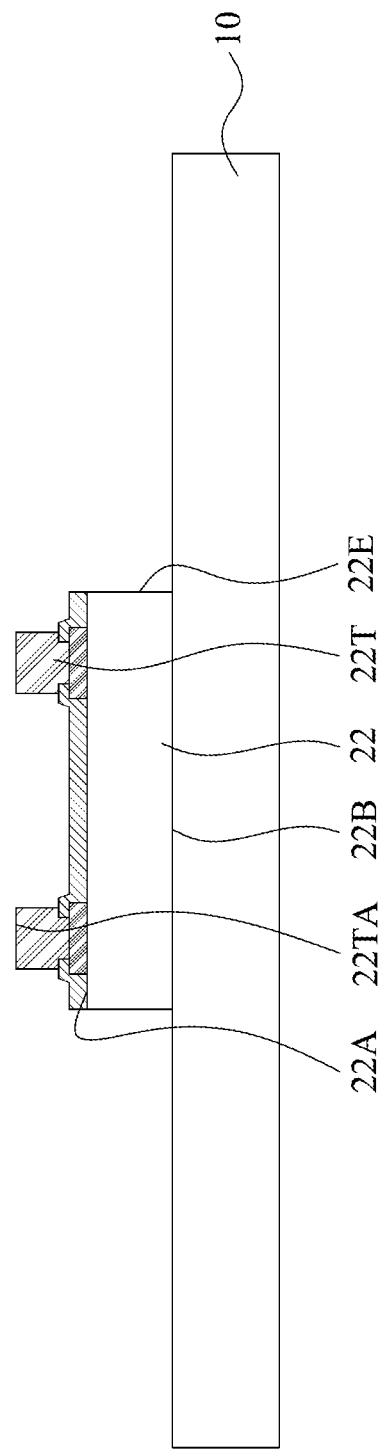
FIG. 6A, FIG. 6B, FIG. 6C, FIG. 6D, FIG. 6E, FIG. 6F and FIG. 6G illustrate operations of manufacturing an electronic device package in accordance with some arrangements of the present disclosure.
Figure 6B:
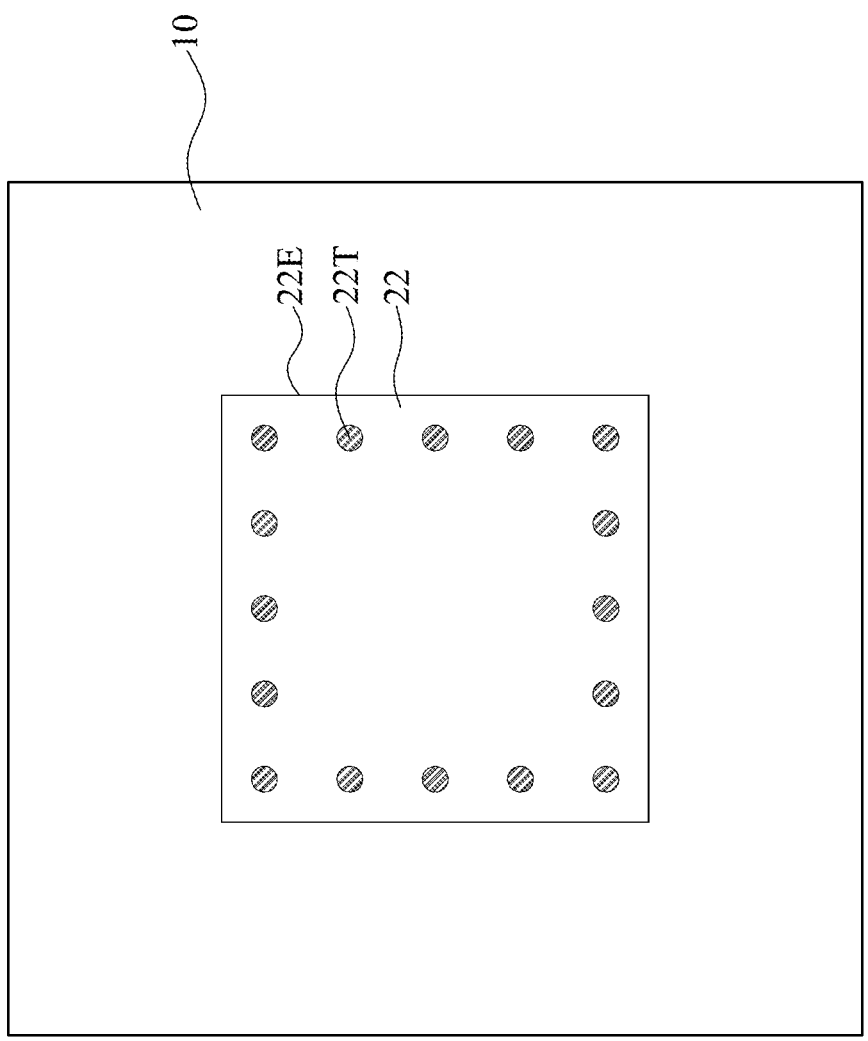

FIG. 6A, FIG. 6B, FIG. 6C, FIG. 6D, FIG. 6E, FIG. 6F and FIG. 6G illustrate operations of manufacturing an electronic device package in accordance with some arrangements of the present disclosure. An encapsulated wafer including a die such as a semiconductor die is provided. In some embodiments, the encapsulated wafer can be formed as follows. An electronic component 20 is provided on a carrier 10. The electronic component 20 includes a plurality of electrical terminals 22T. In some embodiments, the electronic component 20 is provided on the carrier 10 as illustrated in the processes of FIGS. 6A-6D, but is not limited thereto. As shown in FIGS. 6A-6B, at least one die such as a semiconductor die 22 is disposed on the carrier 10. In some embodiments, the semiconductor die 22 is bonded to the carrier 10 through an adhesive layer (not shown) such as a die attach film (DAF).

Figure 6C:
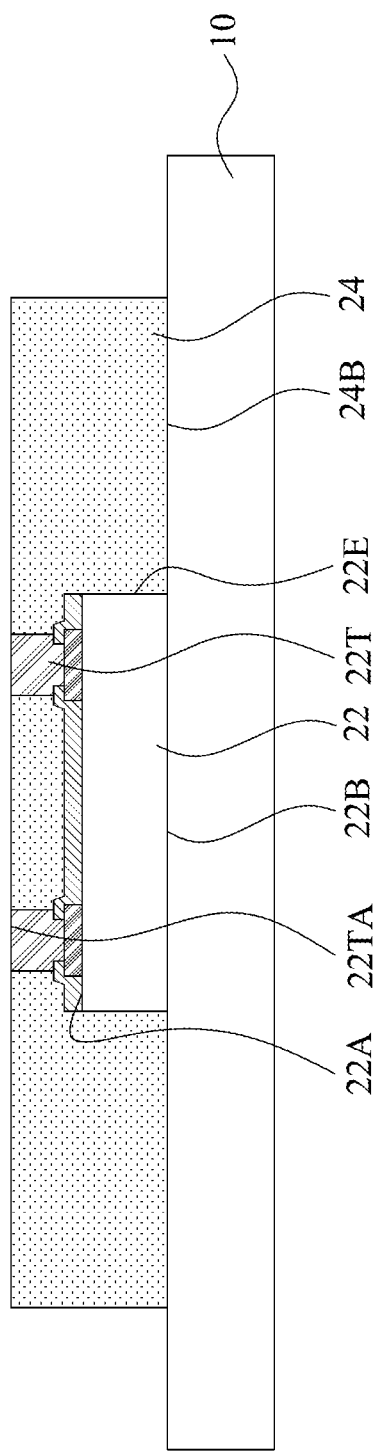
Figure 6D:
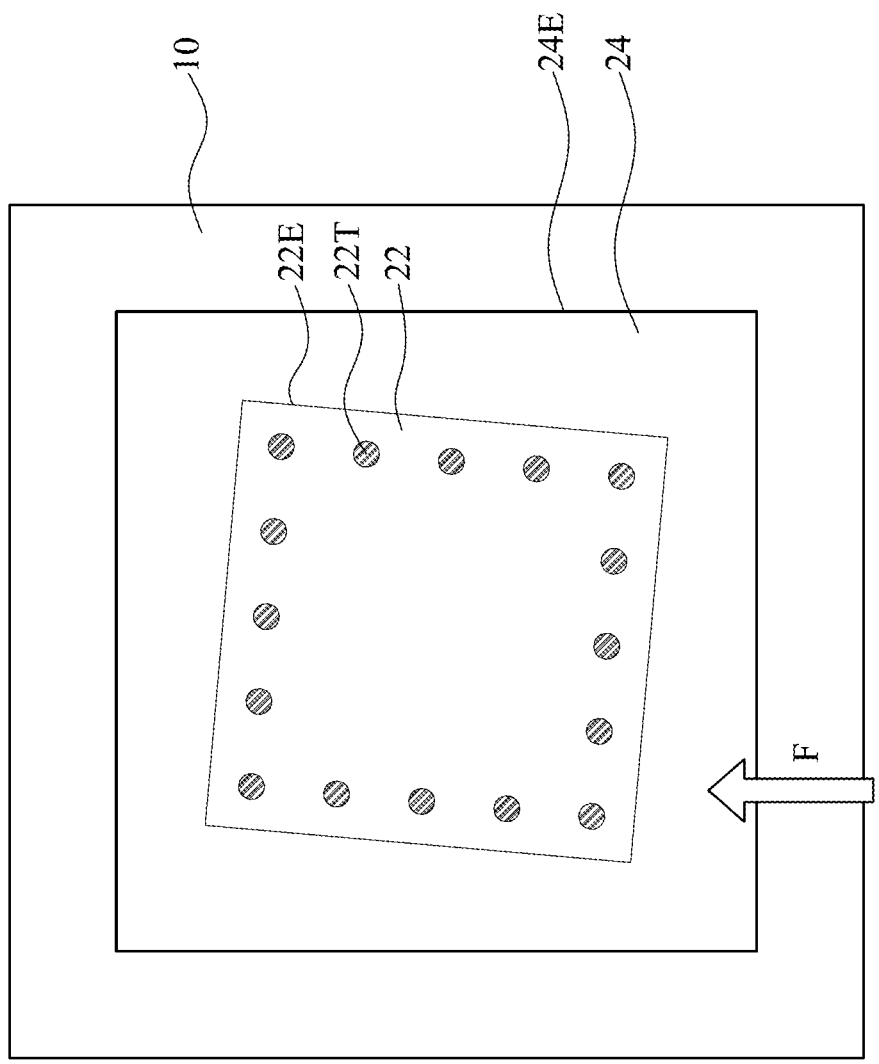

As shown in FIGS. 6C-6D, a mold flow is provided along a direction F toward an edge 22E of the semiconductor die 22 to form an encapsulation layer 24 to encapsulate the semiconductor die 22 to form an encapsulated wafer. The semiconductor die 22 may be pushed by the mold flow, and thus may be shifted. After the encapsulation layer 24 is formed, it is likely the semiconductor die 22 is shifted, and the actual positions of the electrical terminals 22T are deviated from their predetermined regions with respect to the encapsulation layer 24. An actual position of the semiconductor die 22 is measured. In some embodiments, the actual positions of the electrical terminals 22T are measured.

Figure 6E:
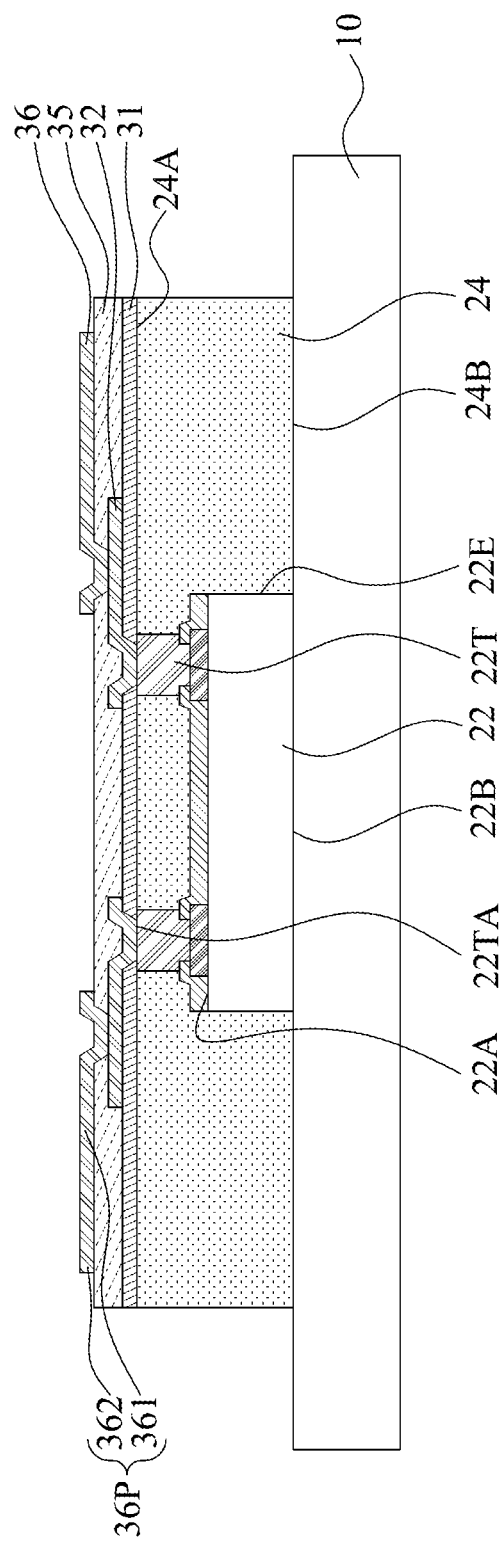

As shown in FIG. 6E, an RDL 30 including a conductive pad 361 and an extension portion 362 is formed on the encapsulation layer 24. The layout of the RDL 30 is provided based on the actual positions of semiconductor die 22 e.g., the actual positions of the electrical terminals 22T before the RDL 30 is formed on the encapsulation layer 24. In some embodiments, the method includes comparing the actual position of the conductive pad 361 with the predetermined region of the conductive via 42V to be formed. In case the die shift is not ignorable, the comparison result may confirm that the actual position of the conductive pad 361 is misaligned with the predetermined region of the conductive via 42V. Accordingly, the pattern of conductive pads 36P in the layout of the RDL 30 is adjusted based on the actual positions of the electrical terminals 22T by adding the extension portions 362. In some embodiments, a layout of a conductive via is projected on the layout of the RDL 30. Then, the extension portion 362 of the conductive pad 36 is added in the layout of the RDL 30 based on a position of the conductive via projected on the layout of the RDL 30. For example, a pattern of the extension portion 361 of the RDL 30 is modified to align with the predetermined region of the conductive via 42V. The predetermined region of the conductive via 42V may be the region where the connection region 42V1 of the conductive via 42V is to be disposed. In some embodiments, the extension portion 362 of the conductive pad 36 is formed based on a shift deviation between a connection region 42V1 of the conductive via 42V and the conductive pad 36P. Specifically, the extension portion 362 is added in case a distance between an edge of the conductive pad 36P and an edge of the connection region 42V1 of the conductive via 42V is smaller than an overlay tolerance Subsequently, the RDL 30 including the conductive pad 36P and the extension portion 362 is formed on the encapsulation layer 24 such that the connection region 42V1 of the conductive via 42V can land on the extension portion 362. In some embodiments, the layout of the RDL 30 is determined based on an actual position of electrical terminals 22T of the encapsulated wafer. In some embodiments, the pattern adjustment of the layout of the RDL 30 is implemented by a mask-less process. By way of example, the layout of the RDL 30 is adjusted in a programmable photomask.

As shown in FIG. 6E, the RDL 30 may include a plurality of circuit layers 32 and 36. In some embodiments, a layout of a bottommost circuit layer 32 of the RDL 30 is adjusted to align with the actual positions of the electrical terminals 22T. In some embodiments, the pattern of conductive pads 36P in the layout of the RDL 30 includes adjusting a layout of a topmost circuit layer 36 of the RDL 30. For example, extension portions 362 are added to the layout of the topmost circuit layer 36.

Figure 6F:
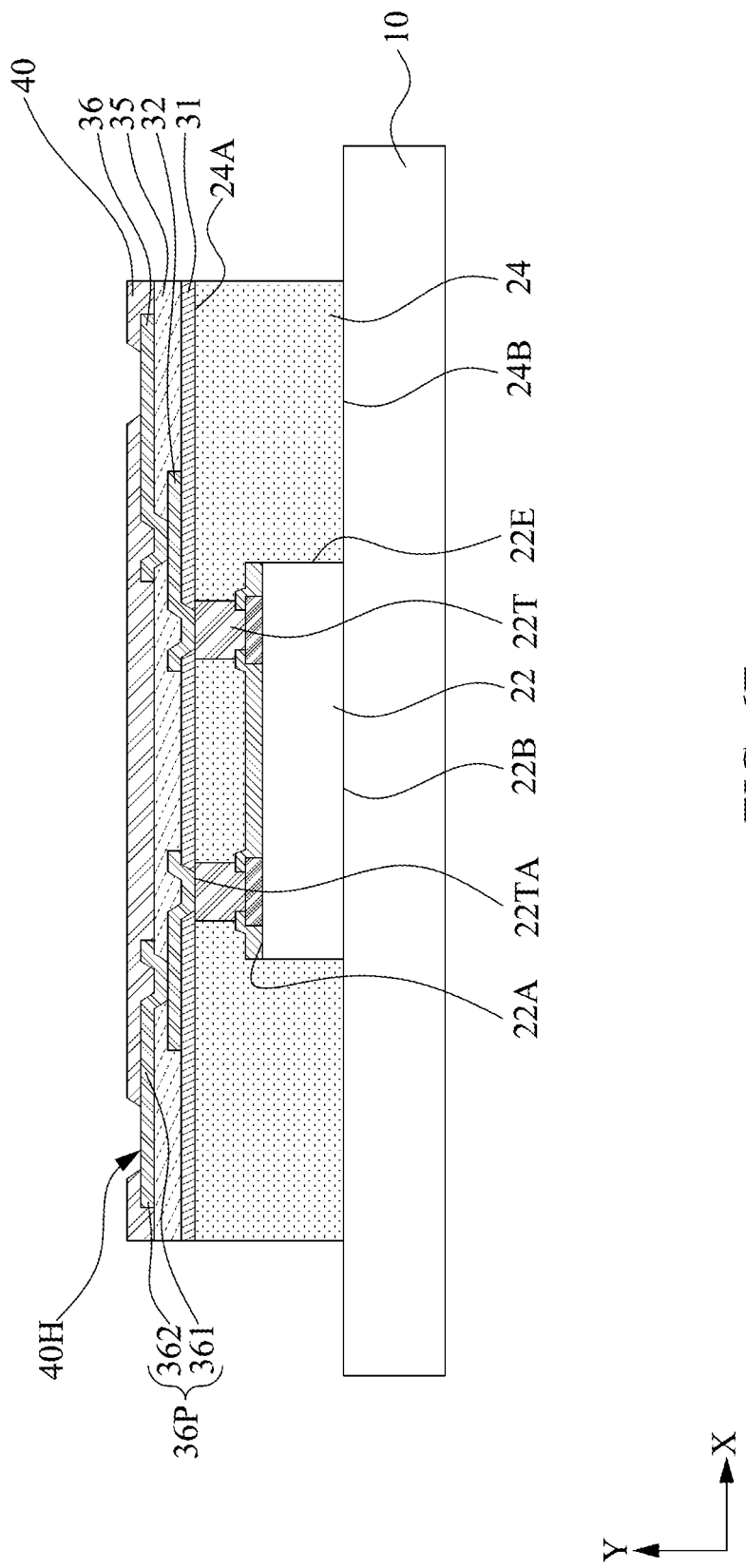

As shown in FIG. 6F, a dielectric layer 40 including via holes 40H is formed on the RDL 30. It is submitted that the extension portions 362 are added to the layout of the topmost circuit layer 36 based on a shift deviation between the layout of the RDL 30 and the layout of the via holes 40H of the dielectric layer 40. The via hole 40H exposes a portion of the extension portion 362 and the pad portion 361. The width of the extension portion 362 is a sum of a gap between the edge 40E of the via hole 40H in the layout of the dielectric layer 40 and the respective conductive pad 36P in the layout of the RDL 30 and an overlay tolerance between the via hole 40H of the dielectric layer 40 and the RDL 30. The extension portion 362 is formed to allow a distance between an edge 362E of the extension portion 362 of the conductive pad 36P and an edge 40E of the predetermined region of the conductive via 42V is smaller than an overlay tolerance.

Figure 6G:
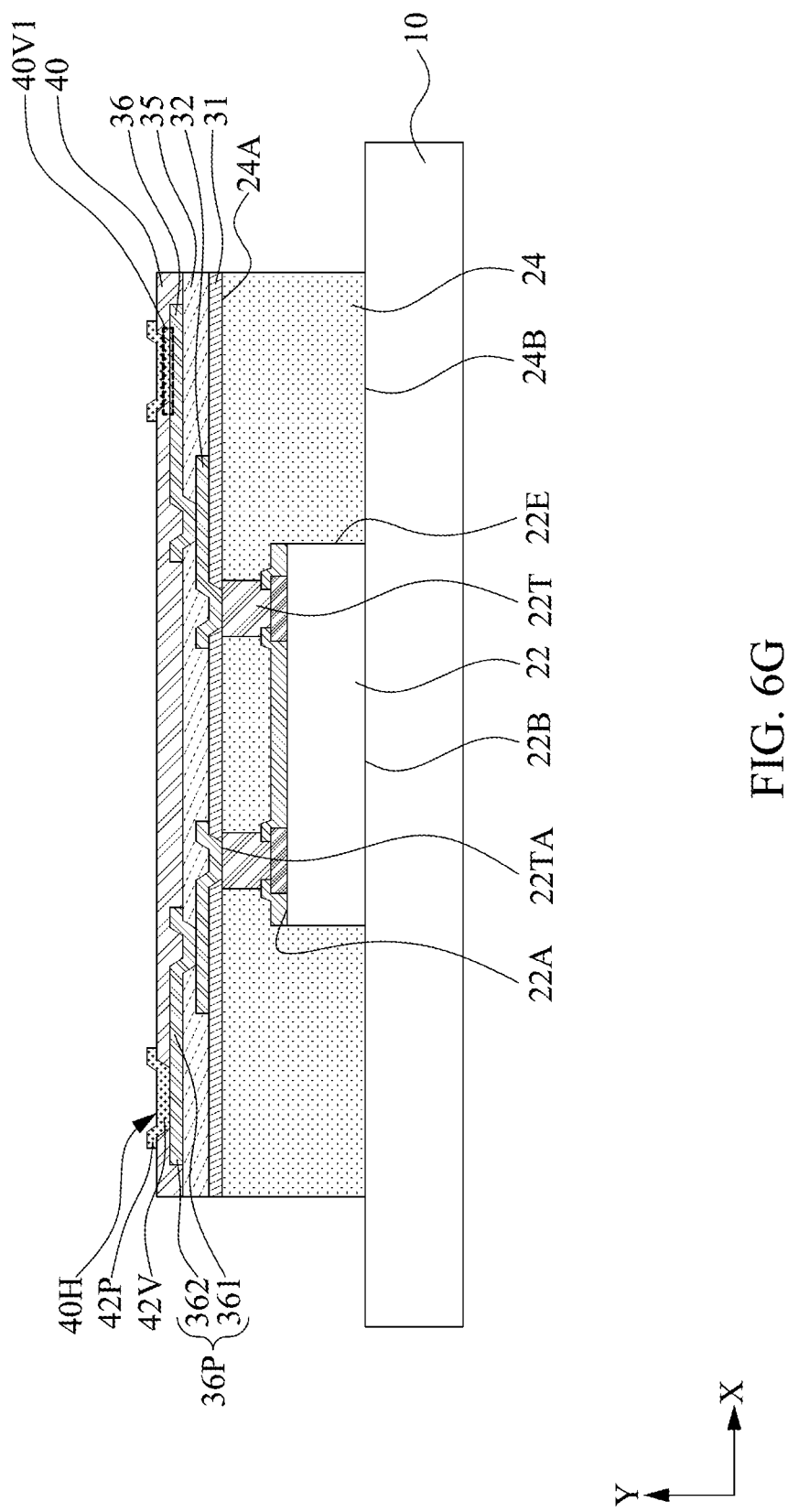

As shown in FIG. 6G, a conductive via 42V and a bonding pad 42P are formed on the dielectric layer 40. In some embodiments, the conductive via 42V and the bonding pad 42P collectively form a UBM. Because the extension portions 362 are added to the layout of the topmost circuit layer 36 based on a shift deviation between the layout of the RDL 30 and the layout of the via holes 40H of the dielectric layer 40, the connection region 42V1 of the conductive via 42V thus can entirely land on the conductive pad 36P without altering the layout of the conductive via 42V. Subsequently, an electronic substrate 50 can be bonded to the conductive via 42V through a connector 52 to form the electronic device package 1 as shown in FIG. 1. In some embodiments, an under bump metallurgy (UBM) configured as a conductive pad 42P may be formed on the conductive via 42V prior to bonding the electronic substrate 50 to the conductive via 42V.

In some embodiments of the present disclosure, the conductive pad of the RDL is locally adjusted by adding an extension portion based on a shift deviation of an encapsulated electronic component. The pattern of the extension portion is specific to the position of the overlying conductive via, and thus the pattern of the RDL is locally modified to the minimum extent necessary to form the extension portion. Accordingly, the design rule and/or spec of the RDL can be satisfied. In addition, the modification of the pattern of the RDL is implemented by a mask-less process, rather than by designing and manufacturing a new photomask. Therefore, the manufacturing cost is reduced.

In the description of some embodiments, a component provided or disposed "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the terms "approximately," "substantially," "substantial," "around" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device package, comprising:
   an encapsulated electronic component;
   a redistribution layer (RDL) disposed above the encapsulated electronic component, wherein the RDL comprises a circuit layer comprising a conductive pad including a pad portion having a curved edge and a center of curvature, and an extension portion protruding from the pad portion and having a curved edge and a center of curvature; and
   a conductive via comprising a connection region connected to the conductive pad of the RDL,
   wherein a center of the connection region of the conductive via is closer to the center of curvature of the edge of the extension portion than to the center of curvature of the edge of the pad portion.

2. The electronic device package according to claim 1, wherein a circular area is defined by using the center of curvature of the extension portion as an origin and a distance between the center of curvature and the curve edge of the extension portion as a radius, and the connection region of the conductive via is located inside the circular area.

3. The electronic device package according to claim 2, where a first distance between a first point of an edge of the connection region of the conductive via and a first point of the curved edge of the extension portion along a first direction perpendicular to the edge of the connection region of the conductive via at the first point of the connection region of the conductive via is different from a second distance between a second point of the edge of the connection region of the conductive via and a second point of the curved edge of the extension portion along a second direction perpendicular to the edge of the connection region of the conductive via at the second point of the connection region of the conductive via.

4. The electronic device package according to claim 1, wherein a distance between the center of curvature of the curved edge of the pad portion and the center of curvature of the edge of the extension portion is larger than zero.

5. The electronic device package according to claim 1, wherein a curvature of the extension portion is larger than a curvature of the pad portion.

6. The electronic device package according to claim 1, wherein the conductive pad further comprises a connection curved edge connecting the curved edge of the pad portion and the curved edge of the extension portion.

7. The electronic device package according to claim 1, further comprising:
   a dielectric layer above the RDL;
   a connector disposed over the conductive via; and
   an under bump metallurgy (UBM) between the conductive via and the connector.

8. The electronic device package according to claim 1, wherein the encapsulated electronic component comprises at least one semiconductor die comprising a plurality of electric terminals, an encapsulation layer encapsulating the semiconductor die and exposing the electrical terminals, and wherein top surfaces of the electrical terminals and a top surface of the encapsulation layer are substantially coplanar, and the RDL is in contact with the top surfaces of the electrical terminals.

9. An electronic device package, comprising:
   a first electronic component; and
   a redistribution layer (RDL) disposed above the first electronic component and electrically connected to the first electronic component, wherein the RDL comprises:
   a circuit layer comprising a first conductive pad and a second conductive pad, wherein the first conductive pad includes:
   a first pad portion having a curved edge and a center of curvature, and a first extension portion protruding from the first pad portion and having a curved edge and a center of curvature; and wherein the second conductive pad includes:
   a second pad portion having a curved edge and a center of curvature, and a second extension portion protruding from the second pad portion and having a curved edge and a center of curvature;
   wherein a first imaginary straight line connecting the center of curvature of the first pad portion and the center of curvature of the second pad portion is non-parallel to a second imaginary straight line connecting the center of curvature of the first extension portion and the center of curvature of the second extension portion.

10. The electronic device package according to claim 9, further comprising a first conductive via comprising a first connection region disposed on the first conductive pad, a second conductive via comprising a second connection region disposed on the second conductive pad, wherein a third imaginary straight line connects a center of the first connection region of the first conductive via and a center of the second connection region of the second conductive via, and an included angel between the third imaginary straight line and the second imaginary straight line is smaller than an included angle between the first imaginary straight line and the second imaginary straight line.

11. The electronic device package according to claim 9, further comprising a first conductive via comprising a first connection region disposed on the first conductive pad, a second conductive via comprising a second connection region disposed on the second conductive pad, wherein a third imaginary straight line connects a center of the first connection region of the first conductive via and a center of the second connection region of the second conductive via, wherein the second imaginary straight line and the third imaginary straight line are substantially parallel.

12. The electronic device package according to claim 9, wherein a first pitch between the center of curvature of the first pad portion and the center of curvature of the second pad portion is substantially equal to a second pitch between the center of curvature of the first extension portion and the center of curvature of the second extension portion.

13. The electronic device package according to claim 9, wherein a curvature of the first extension portion is substantially equal to a curvature of the second extension portion.

14. The electronic device package according to claim 13, wherein a width of the first connection region of the first conductive via is substantially equal to a width of the second connection region of the second conductive via.

15. The electronic device package according to claim 9, wherein the first conductive pad further comprises a first connection curved edge connecting the curved edge of the first pad portion and the curved edge of the first extension portion, the second conductive pad further comprises a second connection curved edge connecting the curved edge of the second pad portion and the curved edge of the second extension portion, a curvature of the first connection curved edge is different from a curvature of the second connection curved edge.

16. The electronic device package according to claim 9, wherein an included angle between an edge of the electronic device package and the first imaginary straight line is larger than an included angel between the edge of the electronic device package and the second imaginary straight line.

17. The electronic device package according to claim 9, further comprising:
   a second electronic component, wherein the second electronic component and the first electronic component are arranged side by side, and the second electronic component is electrically connected to the first electronic component via the RDL.

18. The electronic device package according to claim 17, wherein an upper surface of an electrical terminal of the second electronic component is level with an upper surface of an electrical terminal of the first electronic component.

19. The electronic device package according to claim 18, further comprising:
   an encapsulant encapsulating the first electronic component and the second electronic component, and the RDL is disposed over the encapsulant.

20. The electronic device package according to claim 17, wherein the circuit layer of the RDL vertically overlaps a gap between the first electronic component and the second electronic component.

\* \* \* \* \*